US010008496B1

(12) United States Patent
Sato

(10) Patent No.: US 10,008,496 B1
(45) Date of Patent: Jun. 26, 2018

(54) METHOD FOR FORMING SEMICONDUCTOR DEVICE HAVING CONTINUOUS FIN DIFFUSION BREAK

(71) Applicant: GLOBALFOUNDRIES INC., Grand Cayman (KY)

(72) Inventor: Fumihiko Sato, Lagrangeville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/589,139

(22) Filed: May 8, 2017

(51) Int. Cl.
| | |
|---|---|
| *H01L 27/088* | (2006.01) |
| *H01L 21/8234* | (2006.01) |
| *H01L 29/66* | (2006.01) |
| *H01L 21/02* | (2006.01) |

(52) U.S. Cl.
CPC .... *H01L 27/0886* (2013.01); *H01L 21/02532* (2013.01); *H01L 21/02592* (2013.01); *H01L 21/823431* (2013.01); *H01L 21/823468* (2013.01); *H01L 21/823481* (2013.01); *H01L 29/66545* (2013.01)

(58) Field of Classification Search
CPC ......... H01L 27/0886; H01L 21/823468; H01L 21/02532; H01L 21/02592; H01L 29/66545; H01L 21/823431; H01L 21/823481
See application file for complete search history.

(56) References Cited

U.S. PATENT DOCUMENTS

| | | | |
|---|---|---|---|
| 9,601,567 B1* | 3/2017 | Hsieh | H01L 29/785 |
| 9,627,379 B1* | 4/2017 | Chang | H01L 27/0886 |
| 2016/0190130 A1 | 6/2016 | Yu et al. | |

OTHER PUBLICATIONS

Bardon et al., Layout-inducted stress effects in 14nm & 10nm FinFETs and their impact on performance, Symposium on VLSI Technology Digest of Technical Papers, 2013, T114-T115.
Chen et al., Compact Modeling Solution of Layout Dependent Effect for Fin FET Technology, IEEE, 2015, 110-115.

* cited by examiner

*Primary Examiner* — William Coleman
(74) *Attorney, Agent, or Firm* — Yuanmin Cai; Hoffman Warnick LLC

(57) ABSTRACT

Aspects of the present disclosure includes a semiconductor structure and a method of forming. A plurality of fins on a semiconductor substrate and a plurality of dummy gates is formed. The plurality of dummy gates are oriented perpendicular to the plurality of fins. An amorphous silicon layer is formed directly on top of said plurality of dummy gates and on top of the plurality of fins. A first portion of the amorphous silicon layer between at least one pair of adjacent dummy gates of the plurality of dummy gates is removed to form an opening. A nitride layer is deposited in the opening to cover the plurality of fins. The rest of the amorphous silicon layer between other adjacent dummy gates is removed to expose the underneath plurality of fins. Source/drain regions are formed surrounding the exposed plurality of fins.

19 Claims, 10 Drawing Sheets

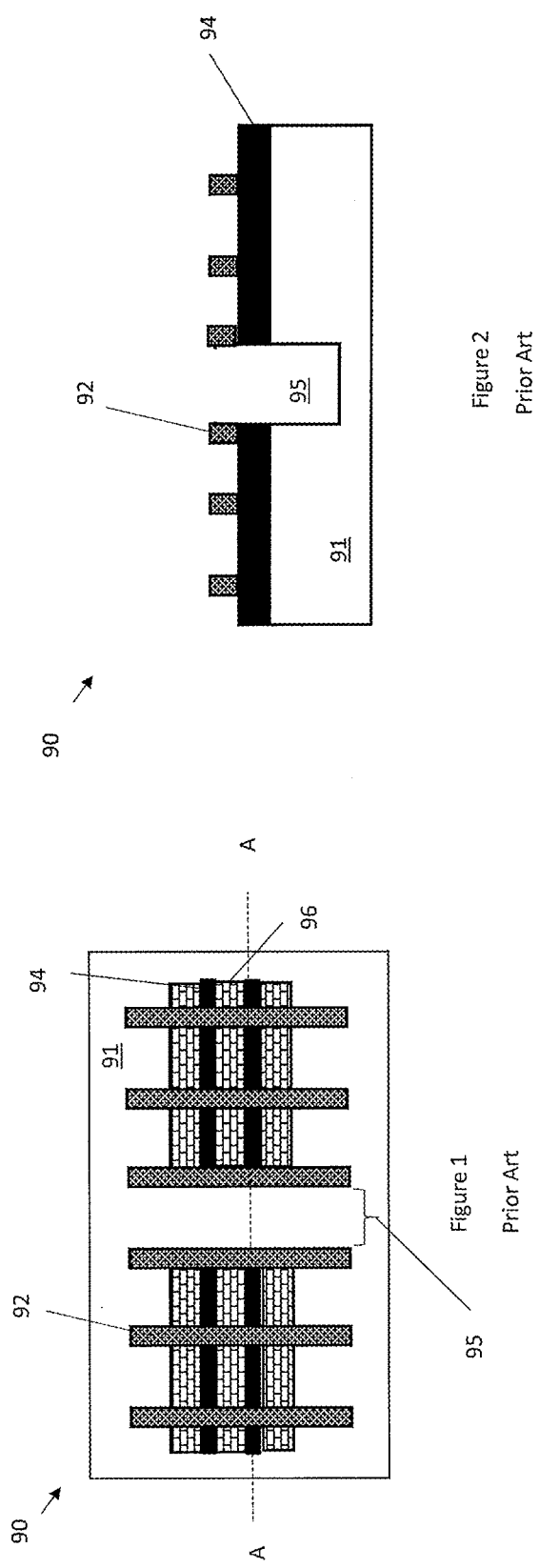

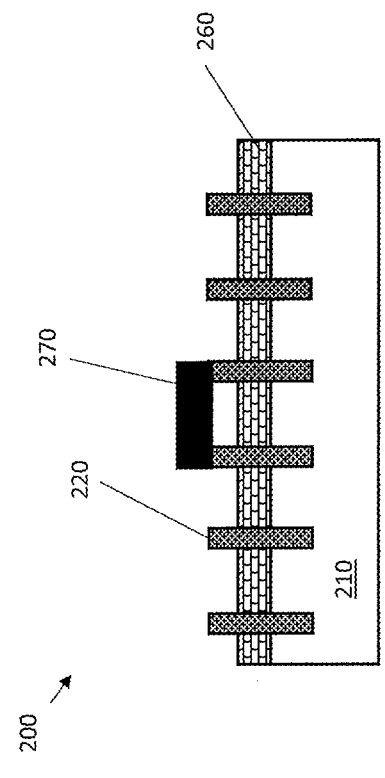
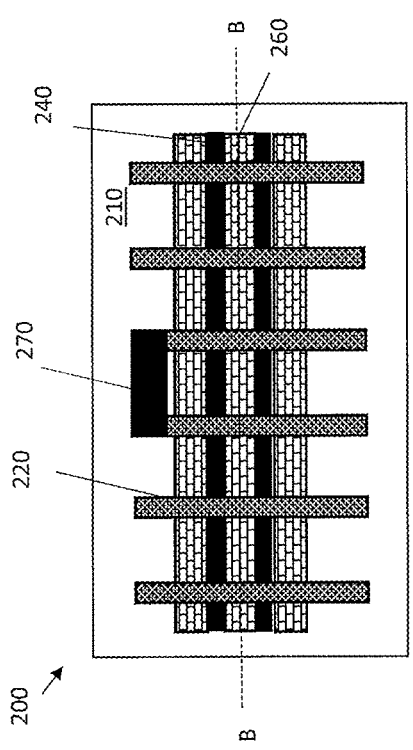
Figure 4
Prior Art
Figure 3
Prior Art

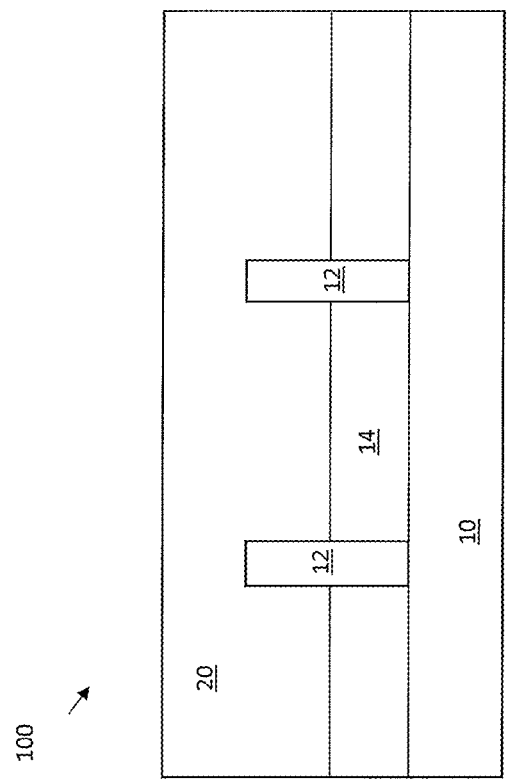
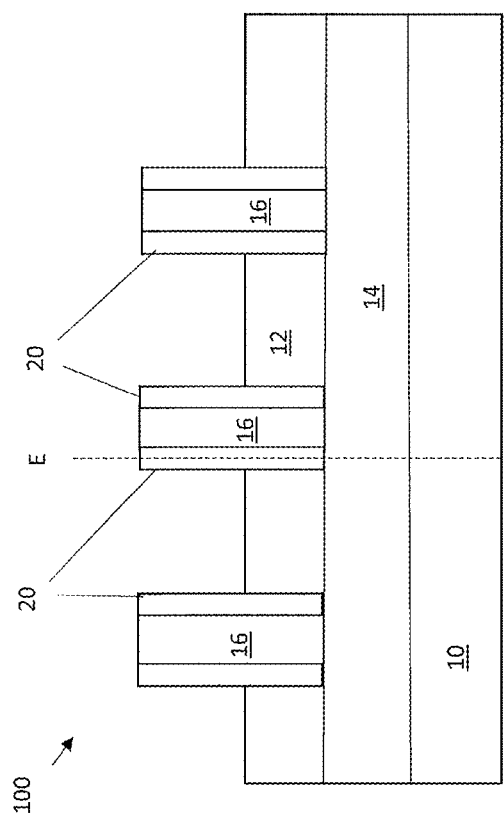

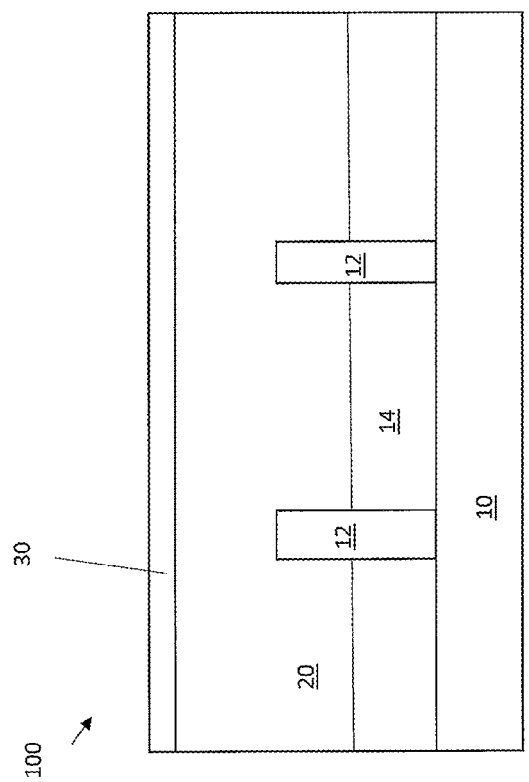
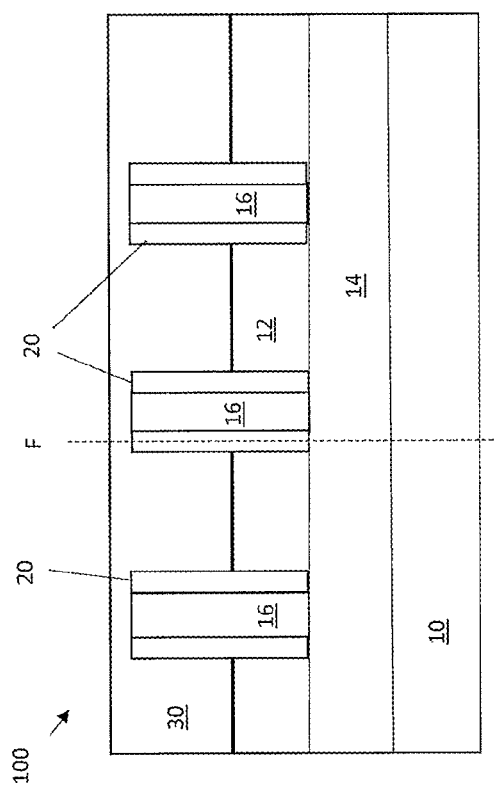

METHOD FOR FORMING SEMICONDUCTOR DEVICE HAVING CONTINUOUS FIN DIFFUSION BREAK

FIELD

The present disclosure generally relates to the fabrication of semiconductor devices, and, more particularly, to a method of forming a diffusion break between finFET devices and the resulting devices.

BACKGROUND

To improve the operating speed of finFETs (fin field effect transistors), and to increase the density of finFETs on an integrated circuit device, device designers have greatly reduced the physical size of finFETs over the years. More specifically, the channel length of finFETs has been significantly decreased, which has resulted in improved switching speed of finFETs. However, decreasing the channel length of a finFET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a short channel effect, wherein the characteristic of the finFET as an active switch is degraded.

To correct this issue, breaks in the fin are employed to isolate cells. However, when breaks in the fin are used to isolate cells, the performance of the cells is degraded. Another way of isolating cells in finFETs is to electrically connect adjacent gates and ground the gates. However, this causes high power consumption.

BRIEF SUMMARY

A first embodiment of the present disclosure discloses a method including forming a plurality of fins on a semiconductor substrate and forming a plurality of dummy gates. The plurality of dummy gates are oriented perpendicular to the plurality of fins. The method includes forming an amorphous silicon layer directly on top of said plurality of dummy gates and on top of the plurality of fins. The method includes removing a first portion of the amorphous silicon layer between at least one pair of adjacent dummy gates of the plurality of dummy gates to form an opening. The opening exposes top surfaces of the plurality of fins. The method includes forming a nitride layer in the opening to cover the plurality of fins. The method includes removing the rest of the amorphous silicon layer between other adjacent dummy gates to expose top surfaces of the plurality of fins and forming source/drain regions surrounding the exposed plurality of fins.

A second embodiment of the present disclosure is method which includes forming a plurality of fins in a semiconductor substrate and forming a plurality of dummy gates above said plurality of fins. The method includes forming an amorphous silicon layer above and between adjacent dummy gates of the plurality of dummy gates. The amorphous silicon layer is removed from between a pair of adjacent dummy gates of the plurality of dummy gates to form a first opening. A nitride layer is formed between the pair of adjacent dummy gates of the plurality of dummy gates. The amorphous silicon layer is removed to exposed the plurality of fins. Source/drain regions surrounding the are formed in the amorphous silicon between the exposed plurality of fins.

A third embodiment of the present disclosure provides a semiconductor structure including a substrate and a plurality of fins disposed on the substrate. The plurality of fins extend in a first direction. The semiconductor structure includes a shallow trench isolation layer directly on top of the substrate adjacent to the plurality of fins. The semiconductor structure includes a plurality of metal gates overlying said substrate and the plurality of fins extending in a direction perpendicular to the first direction. The semiconductor structure includes a nitride layer disposed between adjacent metal gates. Source drain regions are on the shallow trench isolation layer not covered by the nitride layer.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which:

FIG. 1 illustrates a top-down view of a prior art finFET device having a non-continuous fin.

FIG. 2 illustrates a cross-sectional view of a prior art finFET device having a non-continuous fin.

FIG. 3 illustrates a top-down view of a prior art finFET device having an electrical contact connecting adjacent gates.

FIG. 4 illustrates a cross-sectional view of a prior art finFET device having an electrical contact connecting adjacent gates.

FIG. 9 is a cross-sectional view of the semiconductor structure depicting formation spacer material.

FIG. 10 is a cross-sectional view of the semiconductor structure section along section line E-E of FIG. 9.

FIG. 11 is a cross-sectional view of the semiconductor structure depicting formation an amorphous silicon layer.

FIG. 12 is a cross-sectional view of the semiconductor structure section along section line F-F of FIG. 11.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 6:
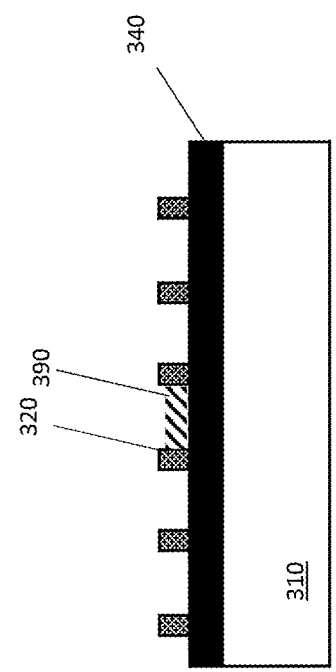
FIG. 6 illustrates a cross-sectional view of an embodiment of a finFET disclosed herein.

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present disclosure generally relates to various methods of forming finFET devices with a double diffusion break without removing portions of a fin and replacing it with a dielectric material or electrically connecting adjacent gates with a tie down. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

A finFET device may include a plurality of fins formed in a wafer; a plurality of gates covering a portion of the fins, where the portion of the fins covered by the gates serves as a channel region of a cell and portions of the fins extending out from under the gates may serve as source and drain regions of the device. A nitride layer may be disposed between adjacent gates to serve as a diffusion break. It should be noted that the finFET disclosed below may be fabricated using either a replacement gate or gate last process flow, or a gate first process flow. A replacement gate process flow will be relied on for the description provided below.

FIGS. 1 and 2 show a simplified schematic of a prior art finFET 90 having a diffusion break 95 in the fins to isolate cells in the finFET 90. Substrate 91 has a plurality of fins 94 disposed thereon. Fins 94 extend in a first direction. Gates 92 extend in a direction perpendicular to fins 94. Diffusion break 95 has a lateral width corresponding to the distance between two adjacent gates 92. Diffusion break 95 is referred to as a double diffusion break as the length of the break is the distance between two adjacent gates 92. FIG. 2 shows a sectional view of FIG. 1 taken along line A-A to illustrate fin 94, around which active regions 96, i.e. source or drain surround. In the embodiment shown in FIGS. 1 and 2, the active regions 96 cover the sidewalls of fins 94. The active regions 96 can be adjacent, next to, or cover the fins 94

FIGS. 3 and 4 show a simplified schematic of another prior art finFET 200 having gate/diffusion contact 270 electrically coupling adjacent gates 220. Substrate 210 has a plurality of fins 240 disposed thereon. Fins 240 extend in a first direction. Gates 220 extend in a direction perpendicular to the fins. Contact 270 isolates the cells on either side of the adjacent gates. Contact 270 is grounded. Although isolating cells in the finFET 200, this configuration results in high power consumption. FIG. 4 shows a sectional view of FIG. 3 taken along line B-B and illustrates active regions 260, i.e. source or drain. Contact 270 is shown in the background. In embodiments, the active regions 260 are adjacent, next to, or cover the fins 240.

Figure 5:
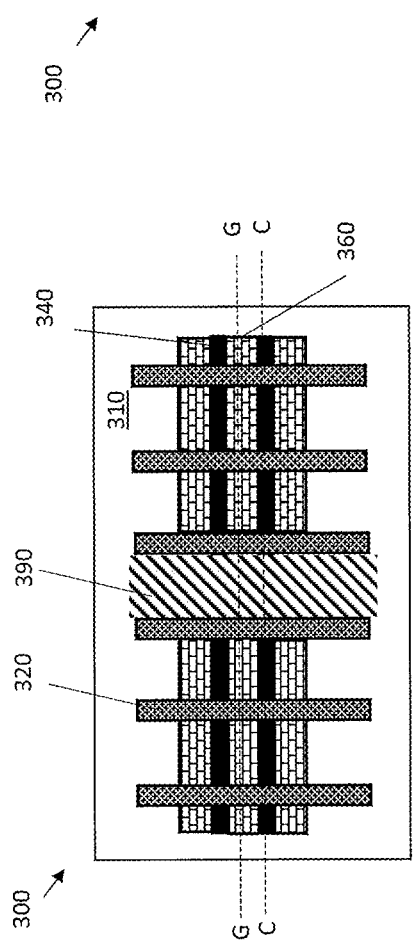
FIG. 5 illustrates a top-down view of an embodiment of a finFET disclosed herein.

Disclosed herein is a finFET and method of manufacture for providing a diffusion break without breaking a fin, which improves performance without resulting in high power consumption. FIGS. 5 and 6 show a simplified schematic of a finFET 300 according to the disclosure having a nitride layer 390 between two adjacent gates 320. The nitride layer 390 is not between every gate 320, only where a diffusion break is desired. Substrate 310 has a plurality of fins 340 disposed thereon. Fins 340 extend in a first direction. Gates 320 extend in a direction perpendicular to the fins 340. FIG. 6 shows a sectional view of FIG. 5 taken along line C-C and illustrates the un-broken fine 340. There is no active region (not shown) between gates 320 having nitride layer 390 there-in-between. In the embodiment shown in FIGS. 5 and 6, active regions 360 cover the sidewalls of fins 340. In embodiments, the active regions 360 are adjacent, next to, and/or cover the fins 340.

Disclosed herein is a method of making a finFET that provides a diffusion break without breaking a fin. The method may be performed in connection with using a replacement gate (RG) fabrication approach. In a RG fabrication approach, a semiconductor substrate may be patterned and etched to form fins. Next, a dummy gate may be formed in a direction perpendicular to the length of the fins. For example, the dummy gate may be patterned and etched from a polysilicon layer. The dummy gates may then be surrounded by an inter-level dielectric layer. Later, the dummy gate may be removed by, for example, an anisotropic vertical etch process such as a reactive ion etch (RIE). This creates an opening where a metal gate may then be deposited. A gate dielectric may be deposited below the metal gate over the fins.

The present disclosure generally relates to semiconductor manufacturing, and more particularly to fin field effect transistor devices (finFET) having a nitride layer disposed between adjacent gates to serve as a diffusion break. Herein, a method of manufacturing a finFET is described in detail with reference to the accompanying drawings of FIGS. 7-16, in accordance with an illustrative embodiment.

Figure 8:
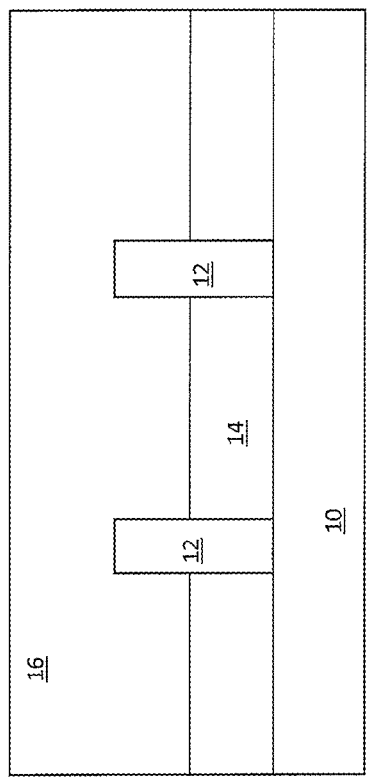
FIG. 8 is a cross-sectional view of the semiconductor structure section along section line D-D of FIG. 7.
Figure 7:
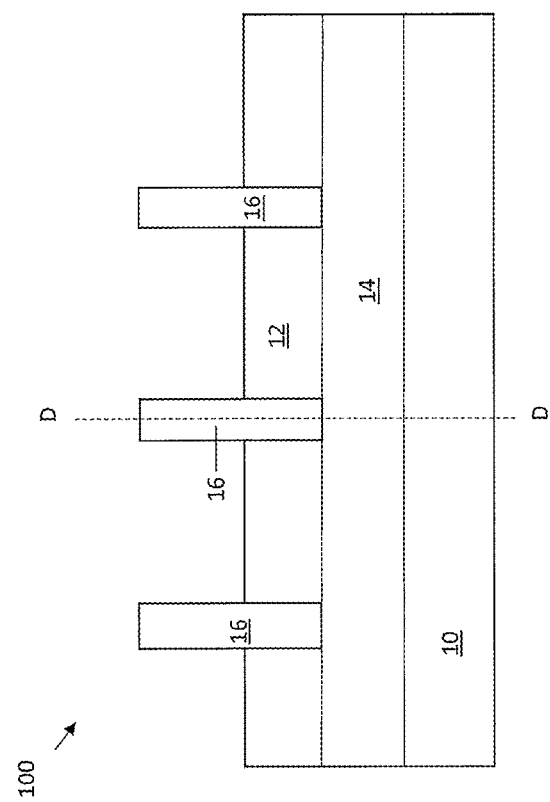
FIG. 7 is a cross-sectional view of the semiconductor structure depicting a plurality of fins, a shallow trench isolation and a plurality of gates according to an exemplary embodiment.

Referring now to FIGS. 7 and 8, a finFET semiconductor structure 100 (hereinafter "structure") is shown cross-sectionally, according to one exemplary embodiment. Substrate 10 may be a bulk substrate, which may be made from any of known semiconductor material such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. Fins 12 may be formed from the substrate 10 according to techniques known in the art. In such cases, components of the structure fins 12, may be formed from the substrate 10. In other embodiments, the substrate 10 may be, for example, a semiconductor-on-insulator (SOI) substrate, where a buried insulator layer separates a base substrate from a top semiconductor layer. In such cases, components of the structure 100, including the fin 12, may be formed in or from the top semiconductor layer of the SOI substrate. Fins 12 may be formed from substrate 10 using known photolithography and etch processes. In an exemplary embodiment, fins 12 may be formed using a sidewall image transfer technique. In an embodiment fins 12 may be formed from a semiconductor substrate. It should be noted that, while the embodiment depicted in the figures includes two fins 12, any number of fins may be formed from substrate 10.

In the embodiment shown in FIGS. 7 and 8, shallow trench isolation 14 (hereinafter "STI") may be deposited after formation of the fins 12. Fins 12 may be isolated from one another by regions of dielectric material such as, for example, STI 14. STI 14 may be formed using known deposition and patterning techniques. Dummy gate structures 16 (hereinafter "dummy gates") are formed through deposition of a dummy gate material on top of fins 12 and STI 14, which is then followed by an etching process with use of a dummy gate mask, as being described below in more details. FIG. 8 is a cross-sectional view along line D-D of FIG. 7.

The dummy gates 16 may be formed over a portion of the fins 12 in structure 100. The portion of the fins 12 covered by the dummy gates 16 may be referred to as a channel region. To form the dummy gates 16, a blanket layer of a sacrificial material may first be deposited above STI 14 and fins 12. The sacrificial layer may include any suitable silicon or polysilicon able to be selectively removed. In one embodiment, the sacrificial layer may include amorphous silicon. The sacrificial layer may be deposited using typical deposition techniques, for example, atomic layer deposition (ALD), molecular layer deposition (MLD), chemical vapor deposition (CVD), physical vapor deposition (PVD), and spin on techniques. In one embodiment, the sacrificial layer may have a vertical thickness, or height, above STI 14 ranging from about 80 nanometers (nm) to about 150 nm. It should be noted that the vertical thickness of the sacrificial layer may correspond to the height of dummy gates 16, which may be patterned from the sacrificial layer. In some embodiments, a thin layer of dummy oxide (not shown) may be deposited prior to depositing the sacrificial layer.

In one embodiment, a cap layer (not shown) may be fabricated atop the blanket layer of sacrificial layer. The cap layer may include any dielectric material known in the art, for example, a nitride. In an embodiment, the cap layer may include a hardmask which may subsequently be used to pattern the dummy gate 16. The cap layer may be deposited using typical deposition techniques, for example, atomic layer deposition (ALD), molecular layer deposition (MLD), chemical vapor deposition (CVD), physical vapor deposition (PVD), and spin on techniques. In one embodiment, the cap layer may include silicon nitride ($Si_3N_4$) deposited using a chemical vapor deposition technique. In one embodiment, the cap layer may have a thickness ranging from about 10 nm to about 50 nm and ranges there between, although a thickness less than 10 nm and greater than 50 nm may be acceptable. Dummy gates 16 may then be patterned from the blanket layer by any lithography technique known in the art. It should be noted that the area of structure 100 covered by the dummy gates 16 may generally be referred to as a gate region, and the areas of structure 100 not covered by dummy gates 16 may generally be referred to as a source/drain region. It should be noted that, while the embodiment depicted in the figure includes three dummy gates 16 (FIG. 7), structure 100 may include any number of dummy gates.

Referring now to FIGS. 9 and 10, a spacer material 20 (hereinafter "spacer") may be formed on opposite sidewalls of the dummy gate 16 in structure 100, according to an exemplary embodiment. Spacer 20 may be formed by conformally depositing or growing a dielectric layer, followed by an anisotropic etch that removes portions of the dielectric layer from the horizontal surfaces of structure 100, while leaving it on the sidewalls of dummy gate 16. In one embodiment, spacer 20 may include any dielectric material such as silicon nitride. Spacer 20 may include a single layer; however, spacer 20 may include multiple layers of dielectric material. Spacer 20 on opposite sidewalls of dummy gates 16 may be referred to as dummy gate spacers. The dummy gate spacers 20 may serve to insulate the active gate from subsequently formed source drain regions. FIG. 10 is a sectional view along line E-E of FIG. 9.

Referring now to FIGS. 11 and 12, an amorphous silicon layer 30 may be formed directly on the exposed top surfaces of STI 14, adjacent to spacer 20 according to an exemplary embodiment. Amorphous silicon layer 30 may be deposited using typical deposition techniques, including, for example, atomic layer deposition (ALD), molecular layer deposition (MLD), chemical vapor deposition (CVD), physical vapor deposition (PVD), and spin on techniques. In an embodiment, for example, spacer 20 may preferably have a different etch rate than amorphous silicon layer 30, to facilitate the selective removal of one with respect to the other, as being described below in more detail with reference to subsequent drawings. More specifically, the materials of spacer 20 may be specifically chosen to facilitate the selective removal of spacer 20 selective to amorphous silicon layer 30. FIG. 12 is a sectional view along line E-E of FIG. 11. In embodiments, amorphous silicon layer 30 is planarized. The planarization may be made through CMP (chemical mechanical polishing).

Figure 13:
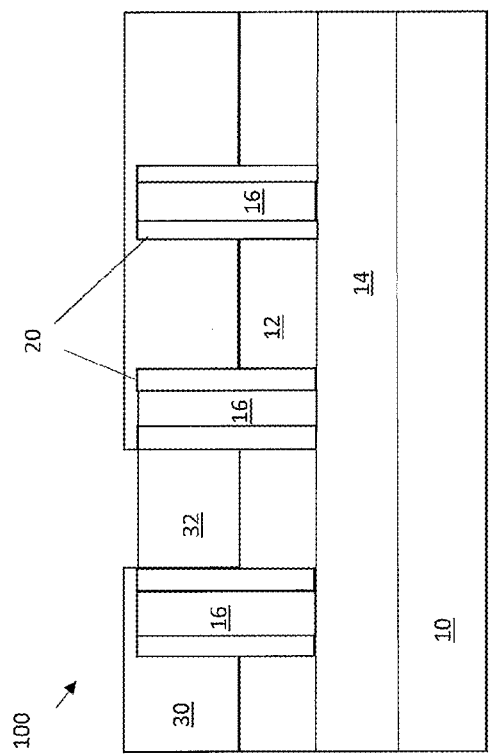
FIG. 13 is a cross-sectional view of the semiconductor structure depicting removal of a portion of the amorphous silicon layer.

Referring now to FIG. 13, a portion of amorphous silicon layer 30 between a pair of adjacent dummy gates 16 may be recessed to the top of fins 12 through a selective etch to form an opening 31. Fins 12 are not etched. The recess may be conducted by a reactive ion etching (RIE) technique or a wet etch technique. Fins 12 have an oxide film on the surface which protects fin 12 from the selective etch. The selective etch may be accomplished by forming a hard mask layer (not shown) above amorphous silicon layer 30 and above dummy gates 16. An opening is formed in the hard mask layer (not shown) to expose amorphous silicon layer 30 between adjacent dummy gates 16. The opening is above the fins and on both sides of the fins 12. Amorphous silicon layer 30 between adjacent dummy gates is removed through a selective etch as discussed above. In embodiments, a photoresist mask (not shown) may be used to form the hard mask layer (not shown).

Figure 14:
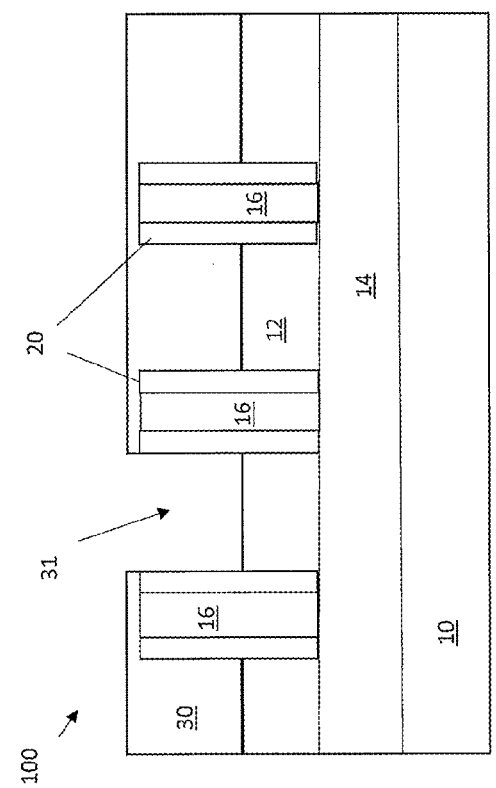
FIG. 14 is a cross-sectional view of the semiconductor structure depicting deposition of a nitride layer.

Next, a nitride film (layer) 32 is deposited in opening 31 (FIG. 13), and is shown in FIG. 14. Nitride film 32 fills opening 31 and is then recessed back to a top surface of dummy gates 16. The deposition of nitride film 32 may be conducted by any of the processes described above. The recessing back to the top of the spacers may be conducted by the etching techniques described above. In embodiments, an opening in the nitride layer 32 is formed wherein the opening stops at the top surface of the plurality of dummy gates 16.

Figure 15:
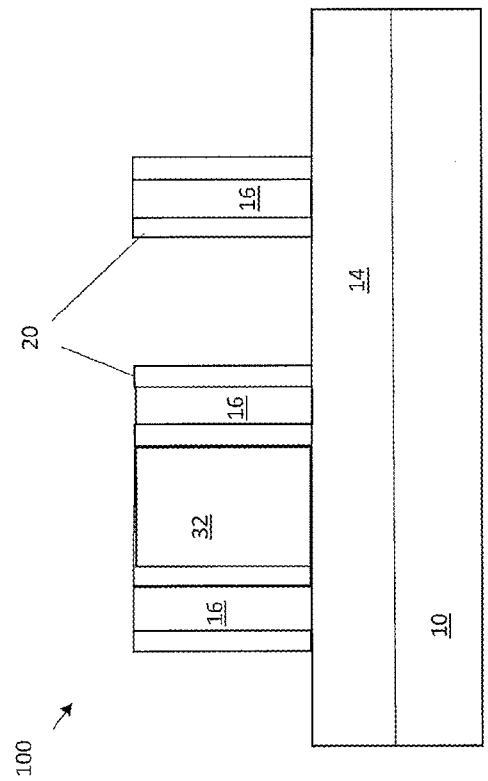
FIG. 15 is a cross-sectional view of the semiconductor structure between a pair of fins depicting deposition of a nitride layer.

FIG. 15 shows the removal of remaining amorphous silicon 30. FIG. 15 is a sectional view between a pair of fins 12, and fins 12 (between the dummy gates 16 in the background) is not shown for clarity purpose. The removal of amorphous silicon 30 is done selectively so nitride film (layer) 32 remains over a first portion of STI 14. The removal may be carried out by a reactive ion etching (RIE) technique or a wet etch technique. The removal or the amorphous silicon may be made up to a top surface of STI 14.

Figure 16:
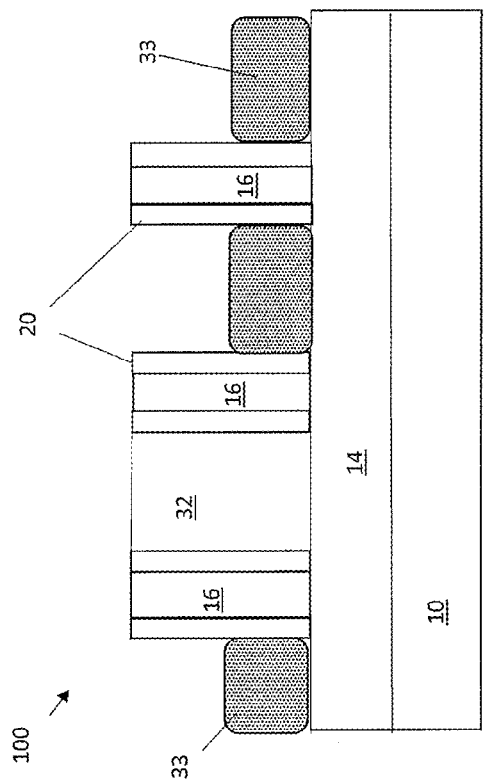
FIG. 16 is a cross-sectional view of the semiconductor structure between a pair of fins depicting epitaxially growth of a source drain region.

FIG. 16 shows the growth of source and drain regions 33 over a second portion of STI 14 (distinct from first portion of STI 14, with overlying nitride layer 32). FIG. 16 is a cross-sectional view along line G-G of FIG. 5 between fins 12 (which is now covered by source/drain regions 33 and nitride film 32) showing the source/drain regions 33. Source/drain regions may be grown in the area above STI 14 between the fins 12. The fins 12 adjacent to the area may serve as seed layers for growing the source/drain regions 33. Source/drain regions 33 may include any dopant concentration according to the characteristics of structure 100. For example, in one embodiment where the structure 100 is an n-type field effect transistor (n-FET) device, source/drain regions 33 includes the amorphous silicon. The source/drain regions 33 may be doped by any known n-type dopant use in the fabrication of n-FET devices such as, for instance, phosphorus or arsenic.

For example, in another embodiment where the structure 100 is a p-type field effect transistor (p-FET) device, the source drain region 33 may be doped by any known p-type dopant use in the fabrication of p-FET devices such as, for instance, boron. In one embodiment, the dopant concentration in the source drain region 33 may range from approximately $4 \times 10^{20}$ cm$^{-3}$ to approximately $9 \times 10^{20}$ cm$^{-3}$. Examples of various epitaxial growth techniques used in forming the source drain region 33 may include, for example, rapid thermal chemical vapor deposition, low energy cluster beam deposition, ultra-high vacuum chemical vapor deposition, and atmospheric pressure chemical vapor deposition. There is no epitaxially growth in the active regions (source/drain) covered by the nitride layer 32. The height of source/drain regions 33 may be slightly above the height of the fins 12 or level with the height of the fins 12.

Figure 17:
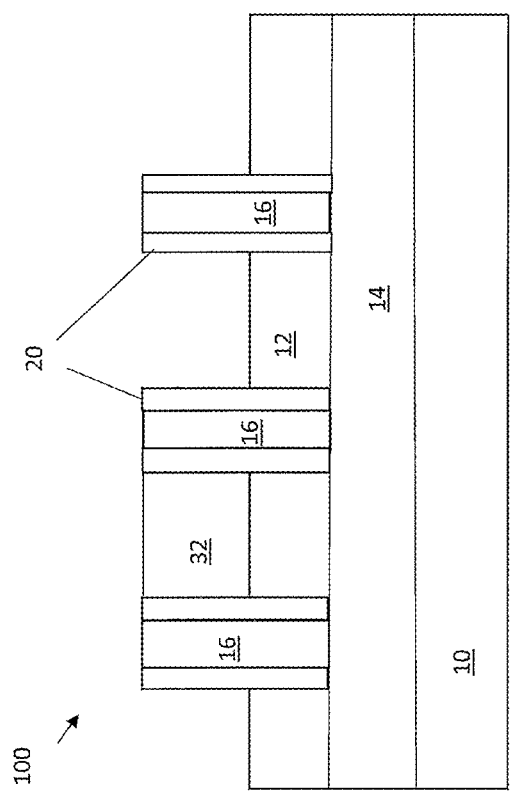
FIG. 17 is a cross-sectional view of the semiconductor structure along a fin after epitaxilly growth of a source drain region.

FIG. 17 is a cross-sectional view along line C-C of FIG. 5 along fin 12 between the dummy gates 16. The source/drain regions 33 in FIG. 16 are grown from the fins 12 shown in FIG. 17.

Figure 18:
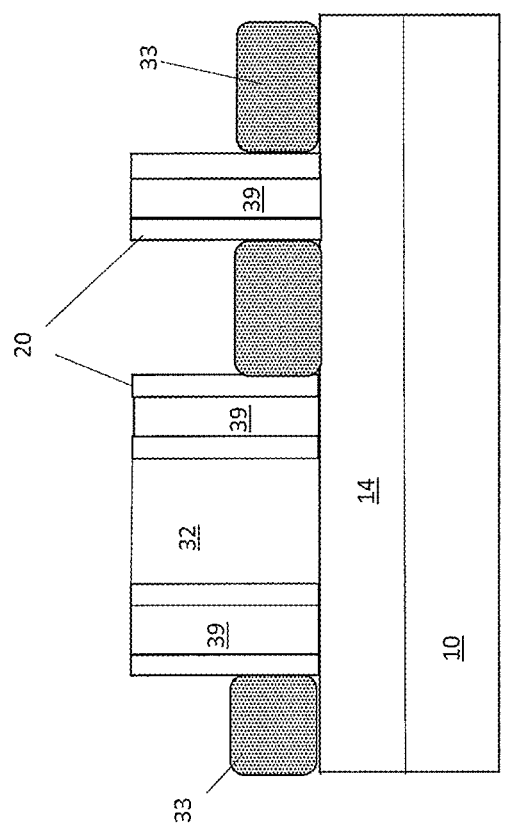
FIG. 18 is a cross-sectional view of the semiconductor structure between a pair of fins depicting replacement metal gates.

Dummy gates 16 and spacers 20 may then be surrounded by an inter-level dielectric. Later, dummy gates 16 may be removed from between the pair of spacers 20 by, for example, an anisotropic vertical etch process such as a reactive ion etch (RIE) process. This creates an opening (not shown) between the pair of spacers 20 where replacement metal gates 39 may then be formed. This is shown in FIG. 18, which is a sectional view between a pair of fins 12 (not visible).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the disclosure. The terminology used herein was chosen to best explain the principles of the embodiment, the practical application or technical improvement over technologies found in the marketplace, or to enable others of ordinary skill in the art to understand the embodiments disclosed herein.

I claim:

1. A method comprising:
   forming a plurality of fins on a semiconductor substrate;
   forming a plurality of dummy gates, the plurality of dummy gates oriented perpendicular to the plurality of fins;
   forming an amorphous silicon layer directly on top of said plurality of dummy gates and on top of the plurality of fins;
   removing a first portion of the amorphous silicon layer between at least one pair of adjacent dummy gates of the plurality of dummy gates to form an opening, said opening exposing the plurality of fins between the adjacent dummy gates;
   forming a nitride layer in the opening to cover the plurality of fins;
   removing rest of the amorphous silicon layer between other adjacent dummy gates to expose the plurality of fins underneath thereof; and
   forming source/drain regions surrounding the exposed plurality of fins.

2. The method of claim 1, further comprising:
   forming a shallow trench isolation layer between said plurality of fins and directly on top of the semiconductor substrate.

3. The method of claim 1, wherein the semiconductor substrate is selected from a group consisting of: silicon, germanium, silicon-germanium alloy carbon-doped silicon-germanium alloy, and compound (e.g. III-V and II-VI) semiconductor materials.

4. The method of claim 1, wherein forming source drain regions comprises epitaxially growing a semiconductor material from the exposed plurality of fins.

5. The method of claim 1, further comprising:
   forming spacers on opposite sidewalls of the plurality of dummy gates before forming the amorphous silicon layer.

6. The method of claim 4, further comprising replacing said plurality of dummy gates with replacement metal gates.

7. The method of claim 5, further comprising replacing said plurality of dummy gates with replacement metal gates.

8. A method, comprising:
   forming a plurality of fins in a semiconductor substrate;
   forming a plurality of dummy gates above said plurality of fins;
   forming an amorphous silicon layer above and between adjacent dummy gates of the plurality of dummy gates;
   removing the amorphous silicon layer from between a pair of adjacent dummy gates of the plurality of dummy gates to form an opening;
   forming a nitride layer in the opening between the pair of adjacent dummy gates of the plurality of dummy gates;
   removing rest of the amorphous silicon layer to expose the plurality of fins covered thereby; and
   forming source/drain regions surrounding the exposed plurality of fins.

9. The method of claim 8, further comprising:
   planarizing the amorphous silicon layer above and between adjacent dummy gates of the plurality of dummy gates.

10. The method of claim 8, wherein the semiconductor substrate is selected from a group consisting of: silicon, germanium, silicon-germanium alloy and carbon-doped silicon-germanium alloy.

11. The method of claim 8, further comprising:
forming spacers on opposite sidewalls of the plurality of dummy gates.

12. The method of claim 8, further comprising replacing said plurality of dummy gates with replacement metal gates.

13. The method of claim 8, further comprising: forming a shallow trench isolation layer directly on top of the semiconductor substrate adjacent to the plurality of fins.

14. The method of claim 13, wherein removing the rest of amorphous silicon layer comprises removing the amorphous silicon layer between other adjacent dummy gates.

15. The method of claim 13, wherein forming the source/drain regions comprises forming the source/drain regions between the plurality of fins.

16. A semiconductor structure comprising:
a substrate;
a plurality of fins disposed on the substrate extending in a first direction;
a shallow trench isolation layer directly on top of the substrate adjacent to the plurality of fins;
a plurality of metal gates overlying the plurality of fins extending in a direction perpendicular to the first direction;
a nitride layer disposed between sidewalls of a pair of adjacent metal gates over a first portion of the shallow trench isolation layer, the sidewalls extending in a direction perpendicular to the first direction, the nitride layer entirely covering a first portion of the plurality of fins between the pair of adjacent metal gates; and
source drain regions on a second portion of the shallow trench isolation layer not covered by the nitride layer, the second portion being distinct from the first portion.

17. The semiconductor structure of claim 16, wherein spacers are formed on opposite sidewalls of the plurality of metal gates and one of the spacers is located between one of the source drain regions and one of the plurality of metal gates.

18. The semiconductor structure of claim 16, wherein the source drain regions surround the plurality of fins.

19. The semiconductor structure of claim 17, wherein a distinct one of the spacers is located between the one of the plurality of metal gates and the nitride layer.

* * * * *